(12) United States Patent
Hatori et al.

(10) Patent No.: US 9,130,352 B2
(45) Date of Patent: Sep. 8, 2015

(54) OPTICAL SEMICONDUCTOR DEVICE, LIGHT EMITTING DEVICE, OPTICAL TRANSMITTING DEVICE, AND METHOD OF MANUFACTURING OPTICAL SEMICONDUCTOR DEVICE

(71) Applicants: FUJITSU LIMITED, Kawasaki-shi, Kanagawa (JP); NEC Corporation, Minato-ku, Tokyo (JP)

(72) Inventors: Nobuaki Hatori, Tsukuba (JP); Masashige Ishizaka, Tokyo (JP); Takanori Shimizu, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 13/833,663

(22) Filed: Mar. 15, 2013

(65) Prior Publication Data

US 2013/0259081 A1    Oct. 3, 2013

(30) Foreign Application Priority Data

Mar. 30, 2012  (JP) ................................ 2012-081976

(51) Int. Cl.
*H01S 5/40* (2006.01)
*H01S 5/024* (2006.01)
*H01S 5/12* (2006.01)

(52) U.S. Cl.
CPC .......... *H01S 5/4025* (2013.01); *H01S 5/02461* (2013.01); *H01S 5/4031* (2013.01); *H01S 5/12* (2013.01)

(58) Field of Classification Search
CPC ... H01S 5/02252; H01S 5/02461; H01S 5/12; H01S 5/4025; H01S 5/4031
USPC ........................................... 372/50.12
See application file for complete search history.

(56) References Cited

U.S. PATENT DOCUMENTS

| | | | | |
|---|---|---|---|---|
| 4,385,389 | A * | 5/1983 | Botez ...................... | 372/46.012 |
| 5,394,489 | A * | 2/1995 | Koch ............................ | 385/14 |
| 5,398,255 | A * | 3/1995 | Terakado ................. | 372/46.01 |
| 2003/0174753 | A1* | 9/2003 | Yabuki et al. ................ | 372/50 |
| 2004/0066817 | A1* | 4/2004 | Ungar ........................... | 372/45 |

FOREIGN PATENT DOCUMENTS

| | | |
|---|---|---|
| JP | H6-53607 | 2/1994 |
| JP | H7-211934 | 8/1995 |
| JP | 2003-209313 A1 | 7/2003 |

* cited by examiner

*Primary Examiner* — Xinning Niu
(74) *Attorney, Agent, or Firm* — Kratz, Quintos & Hanson, LLP

(57) ABSTRACT

An optical semiconductor device includes: a substrate of semiconductor; an array having a plurality of active regions arranged on the substrate so as to emit light to the same direction, the plurality of active regions being arranged more densely at ends of the array than in the center of the array in a direction crossing the light emitting direction; and electrodes which inject current to the plurality of active regions.

15 Claims, 11 Drawing Sheets

OPTICAL SEMICONDUCTOR DEVICE, LIGHT EMITTING DEVICE, OPTICAL TRANSMITTING DEVICE, AND METHOD OF MANUFACTURING OPTICAL SEMICONDUCTOR DEVICE

CROSS-REFERENCE TO RELATED APPLICATION

This application is based upon and claims the benefit of priority of the prior Japanese Patent Application No. 2012-081976, filed on Mar. 30, 2012, the entire contents of which are incorporated herein by reference.

FIELD

The present invention relates to an optical semiconductor device, a light emitting device, an optical transmitting device, and a method of manufacturing an optical semiconductor device.

BACKGROUND

In recent years, as the performance of an information processor such as a computer is increasing, using optical transmission also for communication between chips on boards in an information processor or between boards has been proposed.

Such an optical transmission technique is also referred to as optical interconnection, which is an optical communication technique of transmitting a light signal in a relatively short distance such as between devices, between boards, between chips, or the like. The speed in the optical interconnection is higher than the speed in a conventional metal wire. By using the optical interconnection, improvements in characteristics such as power consumption of a device, EMI, noise, loss, and the like are expected.

In order to simultaneously transmit a plurality of light signals in an optical interconnection, arranging semiconductor lasers has been considered.

However, when a plurality of semiconductor lasers are disposed so as to be integrated at high density, there is a possibility that temperatures of the semiconductor lasers vary due to heat generation of the semiconductor lasers. The oscillation wavelength of the semiconductor laser changes according to the temperature of a gain region which oscillates a laser beam. There is consequently a case that the oscillation characteristic of each semiconductor laser is influenced by the variations in the temperature.

Japanese Laid-open Patent Publication No. 7-211934
Japanese Laid-open Patent Publication No. 6-53607
Japanese Laid-open Patent Publication No. 2003-209313

SUMMARY

According to an aspect of an embodiment, an optical semiconductor device disclosed in the specification includes: a substrate of semiconductor; an array having a plurality of active regions arranged on the substrate so as to emit light toward the same direction, the plurality of active regions being disposed in ends of the array more densely than in the center of the array in a direction crossing the light emitting direction; and an electrode which injects current to the plurality of active regions.

According to an aspect of the embodiment, a light emitting device disclosed in the specification includes: an optical semiconductor device including a first substrate of semiconductor, an array having predetermined number of active regions arranged on the first substrate so as to emit light toward the same direction, the predetermined number of active regions being disposed more densely at ends of the array than in the center of the array in a direction crossing the light emitting direction, and an electrode which injects current to the predetermined number of active regions, the optical semiconductor device being disposed on a second substrate; and the predetermined number of optical waveguides disposed on the second substrate, and receiving and propagating light emitted from the active regions in the optical semiconductor device.

According to an aspect of the embodiment, an optical transmitting device disclosed in the specification includes:
a light emitting device including a first substrate of semiconductor, an array having predetermined number of active regions arranged on the first substrate so as to emit light toward the same direction, the predetermined number of active regions being disposed more densely at ends of the array than in the center of the array in a direction crossing the light emitting direction, and an electrode which injects current to the predetermined number of active regions, the light emitting device being disposed on a second substrate; and a light receiving device disposed on the second substrate and having the predetermined number of light receiving elements which receive light emitted from the active regions in the light emitting device.

According to an aspect of the embodiment, a method of manufacturing an optical semiconductor device disclosed in the specification includes: forming an array having a plurality of active regions for emitting light toward the same direction, on a substrate of semiconductor, the plurality of active regions being arranged so as to be more densely at ends of the array than in the center of the array in a direction crossing the light emitting direction; and
forming an electrode which injects current to the plurality of active regions.

The object and advantages of the embodiments will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, a preferred embodiment of an optical semiconductor device disclosed in the specification will be illustrated with reference to the drawings. The technical scope of the present invention is not limited to the embodiments but includes the invention described in the scope of claims and its equivalents.

Figure 1:
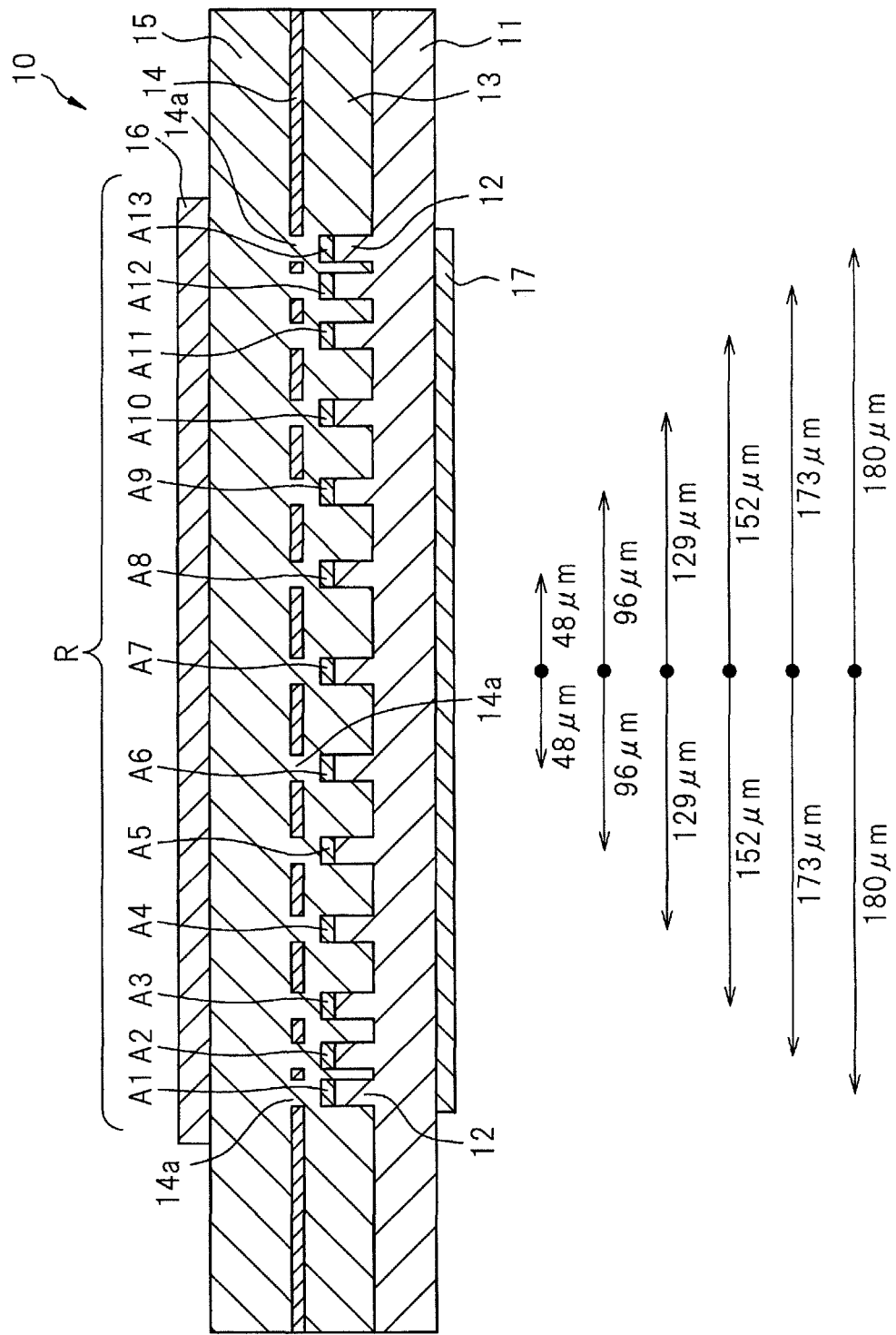
FIG. 1 is a diagram depicting an embodiment of an optical semiconductor device disclosed in the specification.
Figure 2:
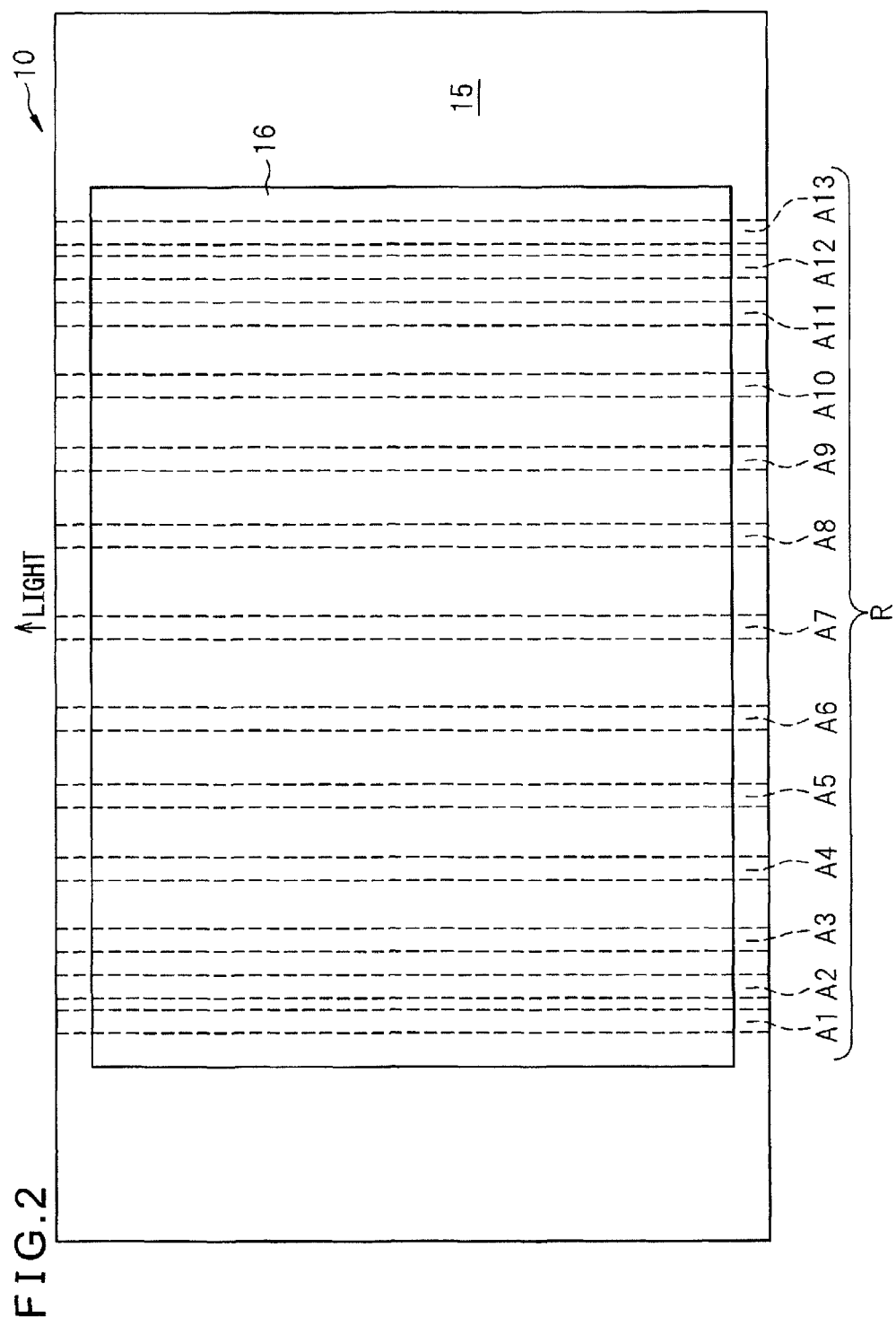
FIG. 2 is a plan view of the optical semiconductor device depicted in FIG. 1.
Figure 3:
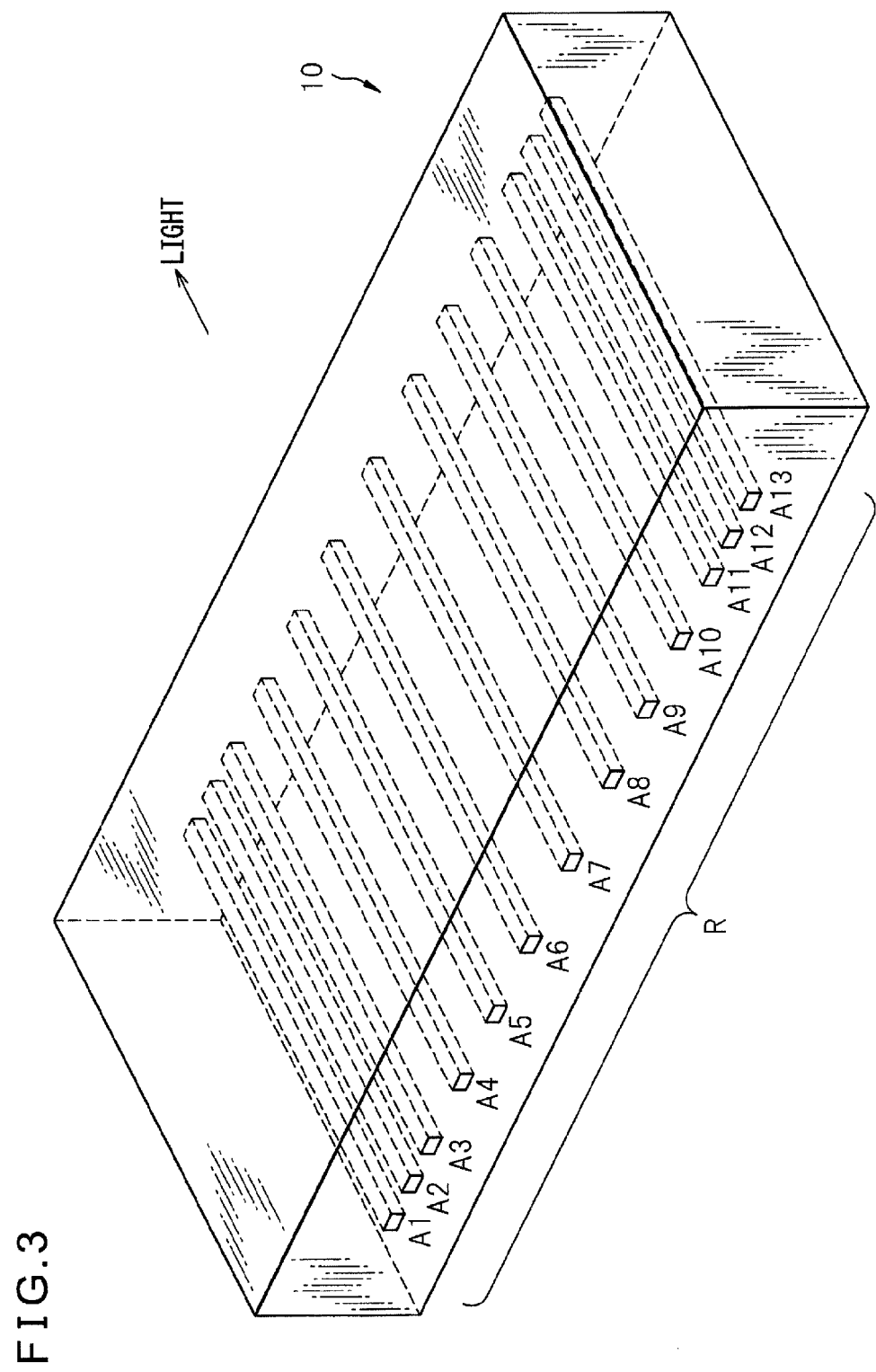
FIG. 3 is a perspective view of the optical semiconductor device depicted in FIG. 1.

FIG. 1 is a diagram depicting an embodiment of an optical semiconductor device disclosed in the specification. FIG. 2 is a plan view of the optical semiconductor device depicted in FIG. 1. FIG. 3 is a perspective view of the optical semiconductor device depicted in FIG. 1.

An optical semiconductor device 10 of the embodiment is a device of oscillating a plurality of laser beams and emitting the laser beams toward the same direction. Active regions oscillating laser beams are disposed on the same semiconductor substrate. The optical semiconductor device 10 is a device which can be suitably used for the optical interconnection technique. As the dimensions of the optical semiconductor device 10, for example, the length in the light emitting direction can be set to 400 μm, and the dimension in the direction orthogonal to the light emitting direction can be set to 600 μm. The dimensions of the optical semiconductor device 10 are an example and can be properly set within the range of dimensions which can be formed by using the semiconductor manufacturing technique.

Hereinafter, the optical semiconductor device 10 will be illustrated more specifically.

The optical semiconductor device 10 has a semiconductor substrate 11, a plurality of lower cladding layers 12 disposed at intervals on the substrate 11, and active regions A1 to A13 disposed on the lower cladding layers 12. The active regions A1 to A13 are disposed apart from the neighboring active regions. The optical semiconductor device 10 of the embodiment has 13 active regions A1 to A13. In the embodiment, the lower cladding layers 12 and the substrate 11 are formed integrally. The lower cladding layers 12 and the substrate 11 are formed by using, for example, n-type InP.

Each of the active regions A1 to A13 has a shape which is elongated in the light emitting direction and both end faces in the longitudinal direction are exposed from both side faces of the optical semiconductor device 10. The active regions A1 to A13 are disposed at intervals in the direction crossing the light emitting direction on the substrate 11 so as to emit light toward the same direction. The direction of emitting light from the end face of each of the active regions A1 to A13 is parallel to the substrate 11.

In the optical semiconductor device 10 of the embodiment, each of the active regions A1 to A13 has a quantum well structure, and a Fabry-Perot semiconductor laser is formed. In each of the active regions A1 to A13, resonation occurs by reflection of light between both end faces in the longitudinal direction, and an oscillated laser beam is emitted from the semi-transmissive end face to the outside. In the active regions A1 to A13, for example, InGaAsP is used to form a well layer and a burrier layer. By each of the active regions A1 to A13, a semiconductor laser other than a Fabry-Perot semiconductor laser may be formed. Forming a semiconductor laser of the DFB type by each of the active regions A1 to A13 allows a control of a wavelength of each stripe.

By the 13 active regions A1 to A13 arranged, an array R of the active regions is formed. The array R emits laser beams oscillated from the 13 active regions A1 to A13 to the same direction. In the optical semiconductor device 10 of the embodiment, the 13 active regions A1 to A13 are disposed at intervals in the direction orthogonal to the light emitting direction.

The active region A7 is disposed in the center of the array R. The active regions A1 and A13 are disposed at both ends of the array R. The active region may not be disposed in the center of the array R.

In the specification, the center of the array R means the center in the direction orthogonal to the direction of the laser beams emitted from the active regions in the array R. The end of the array R means the end of the direction orthogonal to the direction of the laser beam emitted from the active regions in the array R.

Each of the active regions A1 to A13 and the lower cladding layer 12 is buried with a first burying layer 13 made of semiconductor. The first burying layer 13 is disposed between neighboring active regions. The part of the first burying layer 13 around the active regions A1 to A13 has the function of confining light in the active regions A1 to A13.

The optical semiconductor device 10 has a current block layer 14 disposed on the first burying layer 13. The current block layer 14 has openings 14a in regions above the active regions A1 to A13. The current block layer 14 is made of, for example, n-type InP.

On the current block layer 14, a second burying layer 15 made of semiconductor is disposed. The second burying layer 15 is integrated with the first burying layer 13 through the openings 14a in the current block layer 14. The first and second burying layers 13 and 15 may be made of, for example, p-type InP.

Further, the optical semiconductor device 10 has a first electrode 16 disposed on the first burying layer 13 and a second electrode 17 disposed on the face opposite to the first burying layer 13 of the substrate 11. The first and second electrodes 16 and 17 inject current to the active regions A1 to A13.

The current injected from the first electrode 16 to the second burying layer 15 flows through the openings 14a in the current block layer 14 to the first burying layer 13 and, after that, the current is injected to the active regions A1 to A13.

In FIG. 2, the components such as the current block layer 14 are not depicted to make the explanation understood easily. Similarly, components other than the active regions A1 to A13 are not depicted to make the explanation easily understood.

The optical semiconductor device 10 includes a plurality of semiconductor lasers each having a pnpn-type burying structure and has excellent conductivity of heat generated in the active regions A1 to A13.

Hereinafter, the array R of the active regions A1 to A13 will be illustrated more specifically.

In each of the active regions A1 to A13, a part of the injected electricity energy is converted into heat, thereby generating heat. The generated heat is transmitted via the first burying layer 13, the lower cladding layer 12, and the like and is diffused to the periphery. The active region A7 positioned in the center of the array R receives heat generated and diffused from the plurality of active regions positioned on both sides of the active region A7. On the other hand, the active region A1 positioned at one end of the array R only receives heat diffused from one side on which the active region A2 is positioned. Similarly, the active region A13 positioned at the other end of the array R only receives heat diffused from one side on which the active region A12 is positioned.

Therefore, in the optical semiconductor device 10 in operation, the temperature of the active region A7 positioned in the center of the array R is higher than that of the active regions A1 and A13 positioned at both ends of the array R.

When the temperature becomes non-uniform among the active regions as described above, the optical path lengths of the active regions varies since the refractive index varies according to the temperatures of the active regions. Consequently, there is the possibility that the oscillation wavelength varies among the active regions. As a result, the oscillation characteristics of the active regions in the array R may become non-uniform.

Therefore, from the viewpoint of making the temperatures of the active regions uniform, it is preferable to promote diffusion of heat generated in the active regions in the first burying layer 13. Consequently, the thermal conductivity of the first burying layer 13 is preferably, 1 W/(m·K) or higher, more preferably, 50 W/(m·K) or higher, and further more preferably, 70 W/(m·K) or higher.

However, generally, when the thermal conductivity becomes higher, the electric conductivity also becomes higher. Consequently, from the viewpoint that the first burying layer 13 has electric conductivity of semiconductor, in reality, the thermal conductivity of the first burying layer 13 is 100 W/(m·K) or lower.

The concept of the thermal conductivity of the first burying layer 13 is applied also to the second burying layer 15.

In the optical semiconductor device 10, to prevent the temperatures of the active regions from becoming non-uniform, the intervals of the 13 active regions A1 to A13 in the array R are set to be unequal. Concretely, in the direction crossing the light emitting direction and, in the embodiment, in the direction orthogonal to the light emitting direction, the 13 active regions A1 to A13 are disposed so that the density at the end of the array is higher than that in the center of the array.

In the array R, preferably, the distance between active regions decreases from the active region A7 toward the active region A1. Similarly, preferably, the distance between active regions decreases from the active region A7 toward the active region A13.

Concretely, in the optical semiconductor device 10 of the specification, the distance from the active region A7 positioned in the center of the array R to each of the active regions positioned on both sides increases like a logarithm function in order of the active regions. The reason is that since the heat attenuates in an exponential fashion due to diffusion, disposing the active regions as heat sources like a logarithm function decreases the temperature gradient.

Figure 4:
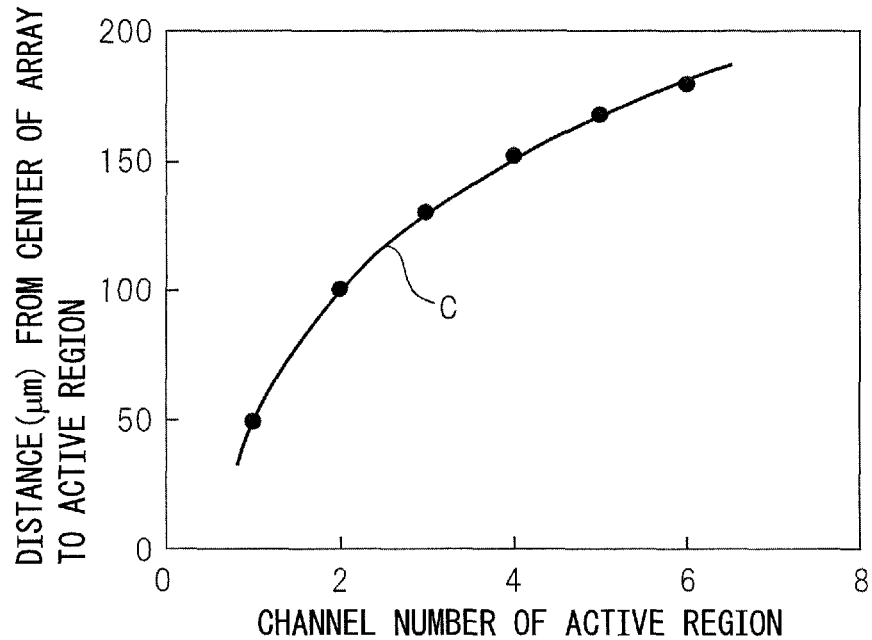
FIG. 4 is a diagram depicting the relation (No. 1) between a distance from the center of an array to an active region and a channel number of the active region.

FIG. 4 is a diagram depicting the relation between a distance from the center of the array R in the optical semiconductor device 10 to an active region and a channel number of the active region.

The horizontal axis of FIG. 4 expresses, using the channel number of the active region A7 as 0, the order of the active regions positioned on both sides of the active region A7 by channel numbers 1 to 6. Specifically, the channel numbers 1 to 6 refer to the active regions A6 to A1 and the active regions A8 to A13. The curve C is a logarithm function curve, and the distances from the active region A7 to the active regions A6 to A1 and the active regions A8 to A13 are expressed on the curve C.

In the example depicted in FIG. 4, the distance between the active region A7 and each of the active regions A6 and A8 is 48 µm. The distance between the active region A7 and each of the active regions A5 and A9 is 96 µm. The distance between the active region A7 and each of the active regions A4 and A10 is 129 µm. The distance between the active region A7 and each of the active regions A3 and A11 is 152 µm. The distance between the active region A7 and each of the active regions A2 and A12 is 173 µm. The distance between the active region A7 and each of the active regions A1 and A13 is 180 µm.

Figure 5:
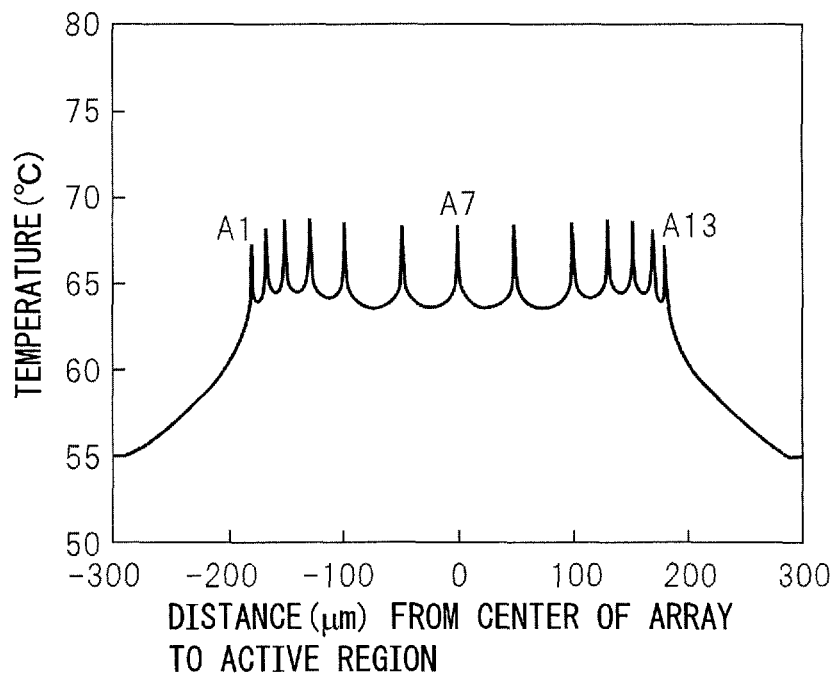
FIG. 5 is a diagram depicting the relation (No. 1) between the temperature of an active region and the distance from the center of the array to the active region.

FIG. 5 is a diagram depicting the relation between the temperature of each of the active regions in the array R expressed in FIG. 4 and the distance from the center of the array to each of the active regions.

FIG. 5 depicts results of solving boundary value problems of the thermal diffusion equation by using the finite element method, with respect to the temperature distribution of a section in a direction orthogonal to the light emitting direction of the optical semiconductor device 10 in operation. Concretely, FIG. 5 depicts the temperature of each part of the active regions. The temperature of atmosphere in which the optical semiconductor device 10 is disposed was set to 25° C., and current was injected from the electrode so that output from each of the active regions becomes 10 mW.

The temperatures of the active regions A1 to A13 are distributed between 67.5° C. and 68.5° C., and the temperature difference among the active regions A1 to A13 is within 1° C.

Hereinafter, increase in the distance from the active region A7 positioned in the center of the array R to each of the active regions positioned on both sides of the active region A7 like a logarithmic function in order of the active regions will be illustrated more specifically.

In the specification, the meaning of the expression "increase like a logarithmic function" includes that the difference between the distance from the center of the array R to each of the active regions and the value of the logarithmic function which increases in order of the active regions is within 30% of the value of the logarithmic function, particularly, 10 to 20% thereof, and further, within 10% thereof. As described above, the distance from the center of the array R to each of the active regions may not always increase with the order of the active regions so as to be positioned on the logarithmic function curve.
of active regions A1 to A13.

Figure 6:
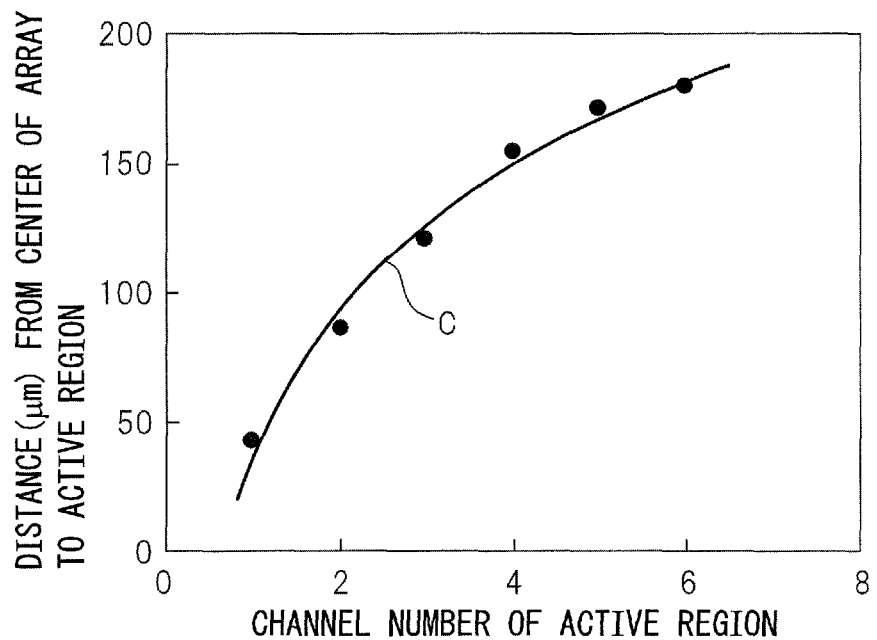
FIG. 6 is a diagram depicting the relation (No. 2) between the distance from the center of the array to an active region and the channel number of the active region.

FIG. 6 is another diagram depicting the relation between the distance from the center of the array R in the optical semiconductor device 10 to each of the active regions and the channel numbers of the active regions.

In the example depicted in FIG. 6, the distance from the center of the array R to each of the active regions does not increase so as not to be positioned on the logarithmic function curve in order of the active regions. In the example depicted in FIG. 6, the difference between the distance from the center of the array R to each of the active regions and the value of the logarithmic function which increases in order of the active regions is within 30% of the value of the logarithmic function.

In the example depicted in FIG. 6, the distance between the active region A7 and each of the active regions A6 and A8 is 43 µm. The distance between the active region A7 and each of the active regions A5 and A9 is 86 µm. The distance between the active region A7 and each of the active regions A4 and A10 is 120 µm. The distance between the active region A7 and each of the active regions A3 and A11 is 154 µm. The distance between the active region A7 and each of the active regions A2 and A12 is 171 µm. The distance between the active region A7 and each of the active regions A1 and A13 is 180 µm.

Figure 7:
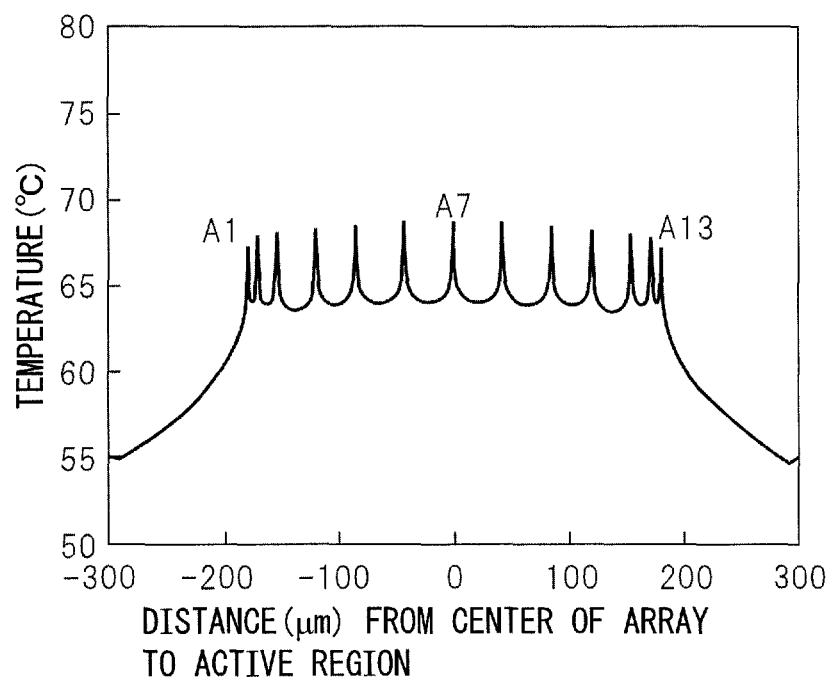
FIG. 7 is a diagram depicting the relation (No. 2) between the temperature of an active region and the distance from the center of the array to the active region.

FIG. 7 is a diagram depicting the relation between the temperatures of the active regions in the array R depicted in FIG. 6 and the distances from the center of the array to the active regions. Results depicted in FIG. 7 are obtained by calculation similar to that of FIG. 5.

The active region A7 positioned in the center of the array R exhibits the highest temperature 68.8° C., the active regions A1 and A13 positioned at both ends of the array R exhibit the lowest temperature 67.3° C., and the temperature difference between the active regions A1 to A13 lies within 1.5° C. or less.

Hereinafter, an example that the difference between the distance from the center of the array R to each of the active regions and the value of the logarithmic function which increases in order of the active regions is larger than 30% of the value of the logarithmic function will be illustrated.

Figure 8:
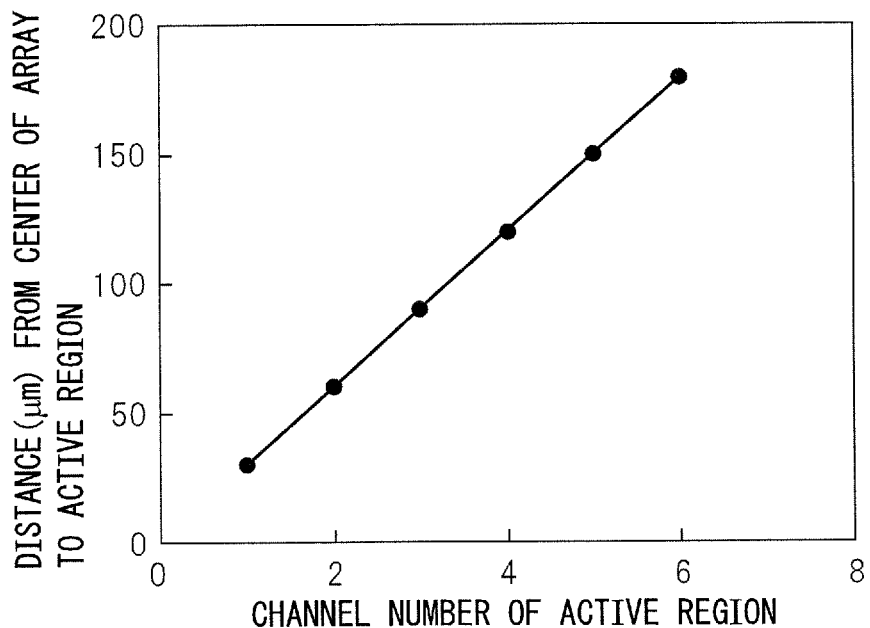
FIG. 8 is a diagram depicting the relation (No. 3) between the distance from the center of the array to an active region and the channel number of the active region.

FIG. 8 is another diagram depicting the relation between the distance from the center of the array in the optical semiconductor device and each of the active regions and the channel numbers of the active regions.

In the example depicted in FIG. 8, the active regions are disposed at equal intervals of 30 µm, and the distance from the active region positioned in the center of the array to each of the active regions on both sides of the active region increases linearly.

Figure 9:
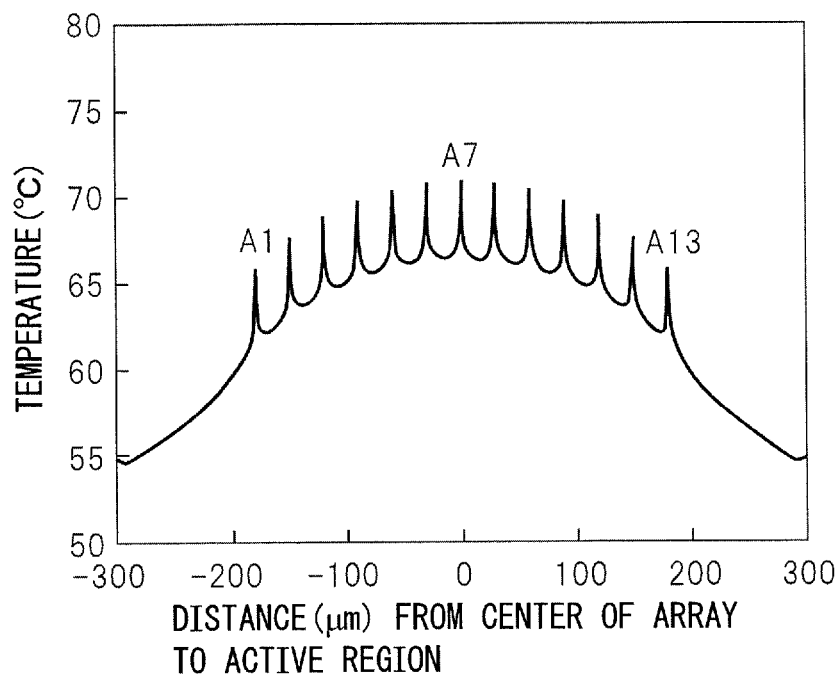
FIG. 9 is a diagram depicting the relation (No. 3) between the temperature of an active region and the distance from the center of the array to the active region.

FIG. 9 is a diagram depicting the relation between the temperature of each of the active regions and the distance from the center of the array to the active region. The result depicted in FIG. 9 is obtained by calculation similar to that in FIG. 5.

In the example depicted in FIG. 9, the active region A7 positioned in the center of the array exhibits the highest temperature of 70.8° C., the temperature decreases toward the outside of the array, and the active regions A1 and A13 positioned at both ends exhibit the lowest temperature of 65.7° C. As described above, in the example depicted in FIG. 9, the temperature difference of 5.1° C. occurs among the active regions.

On the other hand, in the optical semiconductor device 10 of the foregoing embodiment, the temperatures of the active regions are prevented from becoming non-uniform.

In the optical semiconductor device of the embodiment, even when the plurality of active regions are disposed densely and the distance between the active regions is tens µm, the temperatures of the active regions can be made uniform. The reason is that, as described above, the active regions A1 to A13 are buried with the first burying layer 13 and the active regions A1 to A13 are disposed so that the density at the end of the array R is higher than that in the center of the array R in the direction crossing the light emitting direction.

For example, when the first burying layer 13 is made of InP, the thermal conductivity of InP is about 70 W/(m·K). On the other hand, when the active regions A1 to A13 are buried by air, the thermal conductivity of the stationary air is about 0.0241 W/(m·K) and that of even flowing air is 0.06 to 1.5 W/(m·K). Therefore, the thermal conductivity of InP is equal to or higher than 46 times as high as that of air. When the active regions A1 to A13 are buried in the air, it is believed that achieving uniformity of temperatures like in the optical semiconductor device 10 is difficult. By providing the optical semiconductor device 10 with the semiconductor layer having high thermal conductivity and burying the active regions A1 to A13, the temperatures of the active regions can be made uniform.

In this specification, the plurality of active regions may be formed in the following way. By injecting currents into a plurality of regions in an active layer at intervals, a plurality of laser beams are oscillated from each of the current injected regions at intervals. It is called a ridge structured type of an optical semiconductor device.

Hereinafter, an optical transmitter disclosed in the specification will be illustrated with reference to the drawings.

Figure 10:
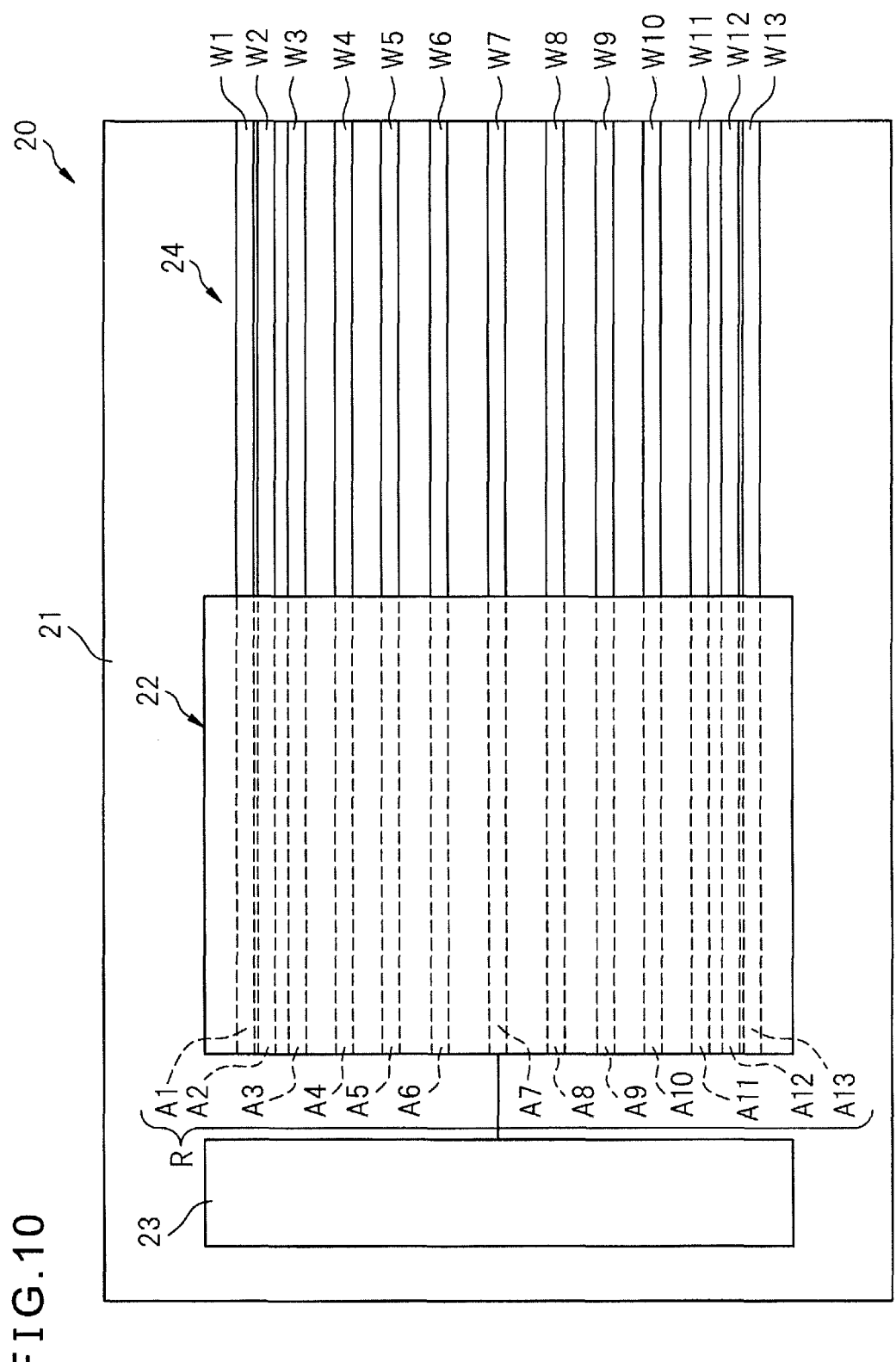
FIG. 10 is a diagram depicting an embodiment of an optical transmitter disclosed in the specification.

FIG. 10 is a diagram depicting an embodiment of the optical transmitter disclosed in the specification.

An optical transmitter 20 of the embodiment has an optical semiconductor device 22 disposed on a semiconductor substrate 21 and emitting a plurality of light rays toward the same direction, a driving unit 23 driving the optical semiconductor device 22, and an optical waveguide array 24 receiving the plurality of light rays emitted from the optical semiconductor device 22 and propagating the light rays.

The optical semiconductor device 22 has a configuration similar to that of the optical semiconductor device 10 described above and disclosed in the specification.

The driving unit 23 supplies power to the optical semiconductor device 22, and causes a laser beam to be emitted from the array R of the optical semiconductor device 22.

The optical waveguide array 24 has 13 optical waveguides W1 to W13 which receive the light emitted from the active regions A1 to A13 of the array R and propagate the light. Each of the optical waveguides W1 to W13 propagates the laser beam received from each of the active regions A1 to A13 and output the laser beam to the outside of the optical transmitter 20.

In the optical transmitter 20, the optical semiconductor device 22, the driving unit 23, and the optical waveguide array 24 are disposed on the same substrate 21. The optical waveguide array 24 can be formed by using a silicon wire optical waveguide on the silicon substrate as the substrate 21. It is also possible to process the part on which the optical semiconductor device 22 is disposed like a canal so that the optical axis of the silicon wire waveguide array 24 and the optical axis of the optical semiconductor device 22 are aligned to form an electrode, and connect the electrode to the first electrode 16 or the second electrode 17 by soldering. Since the silicon wire optical waveguide or the optical semiconductor device mounting part can be manufactured by using the silicon semiconductor microfabrication technique, the optical transmitter 20 can be easily manufactured in large quantity.

Hereinafter, an optical transmitting device disclosed in the specification will be illustrated with reference to the drawings.

Figure 11:
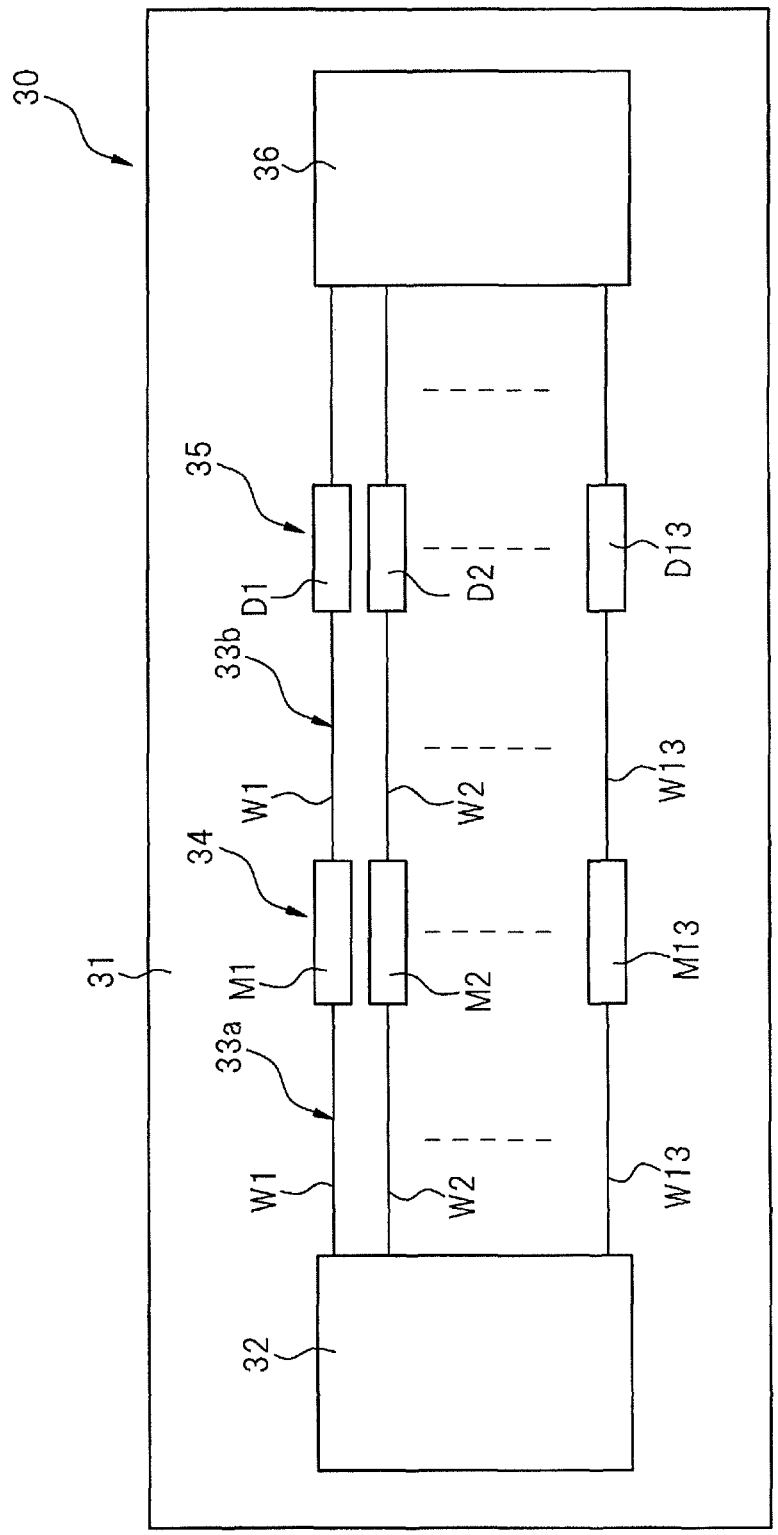
FIG. 11 is a diagram depicting an embodiment of an optical transmitting device disclosed in the specification.

FIG. 11 is a diagram depicting an embodiment of the optical transmitting device disclosed in the specification.

An optical transmitting device 30 of the embodiment has a light emitting device 32 for emitting a plurality of light rays to the same direction, an optical waveguide array 33a which receives the plurality of light rays emitted from the light emitting device 32 and propagates light rays, and an optical modulator array 34 which modulates each of the light rays received from the optical waveguide array 33a and outputs the modulated light ray.

The optical transmitting device 30 also has an optical waveguide array 33b which receives the plurality of light rays output from the optical modulator array 34. The optical transmitting device 30 also has a light receiving device 35 which receives each of the light rays supplied from the optical waveguide array 33b, converts the light ray to an electric signal, and outputs the signal, and a signal processing unit 36 receiving a plurality of electric signals output from the light receiving device 35 and processing the signals.

The light emitting device 32 has a configuration similar to that of the optical semiconductor device 10 described above and disclosed in the specification.

Each of the optical waveguide arrays 33a and 33b has the optical waveguides W1 to W13. Each of the optical waveguide arrays 33a and 33b has a configuration similar to that of the optical waveguide array 24 of the optical transmitter described above and disclosed in the specification.

The optical modulator array 34 has optical modulating elements M1 to M13 receiving light from the optical waveguides W1 to W13 and modulating the light and outputting the modulated light.

The light receiving device 35 has 13 light receiving elements D1 to D13 receiving light from the optical waveguides W1 to W13 and converting the light to an electric signal.

In the optical transmitting device 30, the light emitting device 32, the optical waveguide arrays 33a and 33b, the optical modulator array 34, the light receiving device 35, and the signal processing unit 36 are disposed on the same semiconductor substrate 31.

An embodiment of a preferred method of manufacturing the optical semiconductor device of the foregoing embodiment will be illustrated with reference to the drawings.

Figure 12:
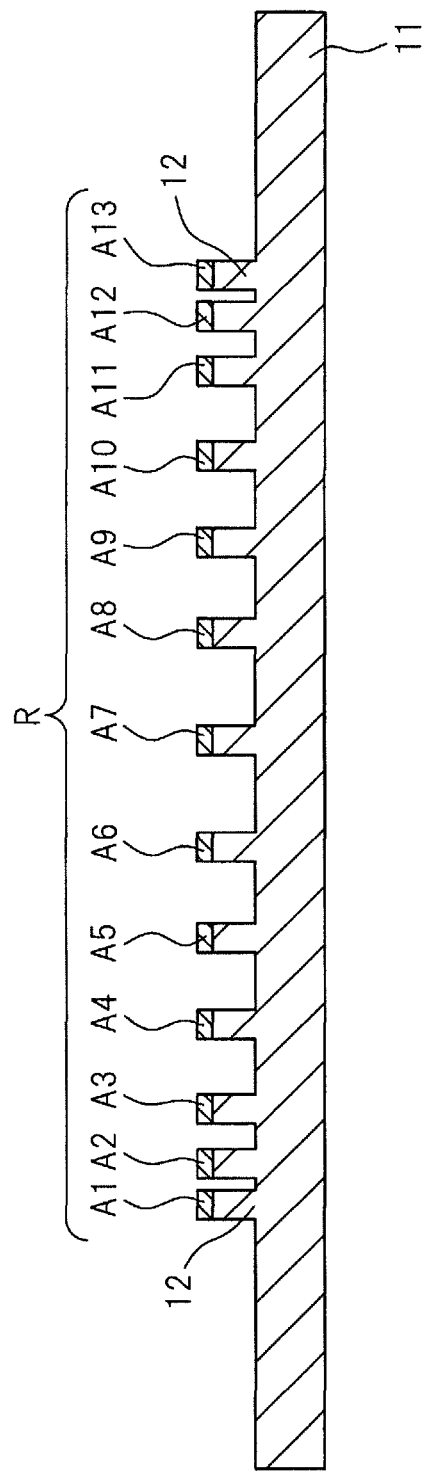
FIG. 12 is a diagram depicting processes (No. 1) of an embodiment of a method of manufacturing an optical semiconductor device disclosed in the specification.

First, an active layer (not depicted) forming the active regions A1 to A13 is formed on the substrate 11 by using the metal organic chemical vapor deposition. As the material of the substrate 11, for example, InP can be used. As depicted in FIG. 12, the active layer is etched so that predetermined number of active regions A1 to A13 are formed, and the part of the substrate 11 other than the active regions A1 to A13 is etched to predetermined depth to form the predetermined number of lower cladding layers 12 and the active regions A1 to A13. As the active regions A1 to A13, a quantum well structure may be formed. By the 13 active regions A1 to A13, the array R of the active regions is formed. In such a manner, in the direction crossing the light emitting direction of the plurality of active regions A1 to A13, the plurality of active regions A1 to A13 are formed at intervals so that the density of the active regions at ends of the array R is higher than that in the center of the array R. As the material of the active regions A1 to A13, for example, InGaAsP having a composition wavelength in the 1.55 μm band can be used. As the width of the active regions A1 to A13, for example, 1.5 μm can be set.

Figure 13:
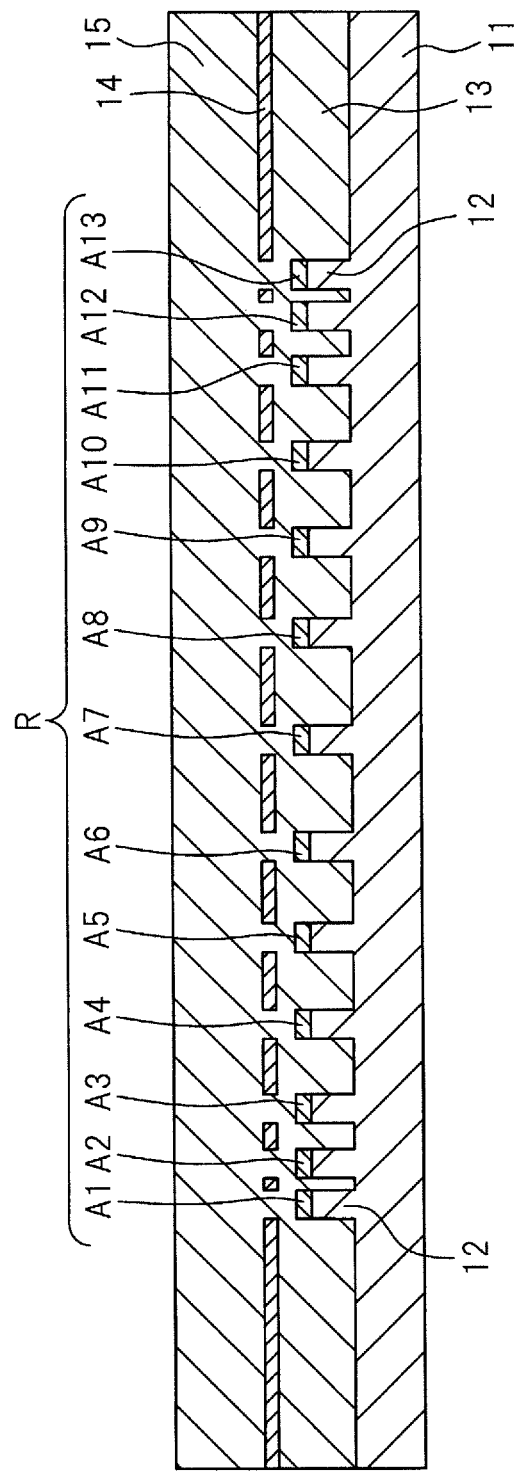
FIG. 13 is a diagram depicting processes (No. 2) of an embodiment of a method of manufacturing an optical semiconductor device disclosed in the specification.

As depicted in FIG. 13, using the metal organic chemical vapor deposition and lithography technique, the first burying layer 13, the current block layer 14, and the second burying layer 15 are formed on the substrate 11. In such a manner, the plurality of active regions A1 to A13 are buried with the burying layer 13.

The first and second electrodes 16 and 17 for injecting current to the active regions A1 to A13 are formed and the optical semiconductor device depicted in FIG. 1 is obtained.

In the present invention, the optical semiconductor device, the light emitting device, the optical transmitting device, and the method of manufacturing the optical semiconductor device of the foregoing embodiments can be properly changed without departing from the gist of the invention. The components of any of the embodiments can also be properly applied to the other embodiments.

For example, although the optical semiconductor device of the embodiment has the pnpn-type burying structure, the optical semiconductor device may have an SI-BH-type burying layer.

Although the optical semiconductor device has the 13 active regions in the embodiment, the number of active regions may be smaller than 13 or larger than 13.

Although the active region has the quantum well structure in the optical semiconductor device of the embodiment, the active region may have another structure as long as the structure has a light emitting function.

Further, although the semiconductor laser is of the edge emitting type in the optical semiconductor device of the embodiment, it may be of a surface emitting type.

Figure 14:
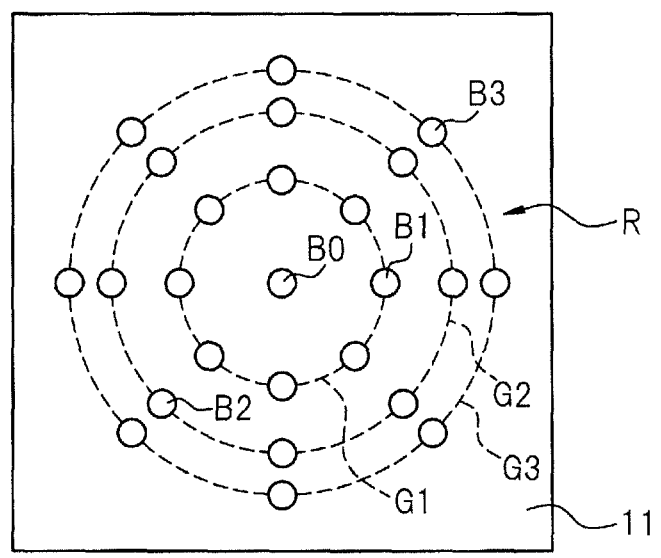
FIG. 14 is a diagram depicting another embodiment of an optical semiconductor device disclosed in the specification.

FIG. 14 is a diagram depicting another embodiment of the optical semiconductor device disclosed in the specification.

The optical semiconductor device of the embodiment has active regions B of the surface emitting type. In the embodiment, the direction of light emitted from a plurality of active regions B is perpendicular to the substrate 11.

In the example depicted in FIG. 14, using an active region B0 positioned in the center of the array R as the center, other active regions B1, B2, and B3 are disposed concentrically. The other active regions B1, B2, and B3 are disposed on a circle G1 positioned innermost side, a circle G3 positioned outermost side, and a circle G2 positioned between the circles G1 and G3.

The radius of the circle G1 is smaller than that of the circle G2, and the radius of the circle G2 is smaller than that of the circle G3.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority and inferiority of the invention. Although the embodiments of the present invention have been described in detail, it should be understood that the various changes, substitutions, and alterations could be made hereto without departing from the spirit and scope of the invention.

What is claimed is:

1. An optical semiconductor device comprising:
   a substrate of semiconductor;
   an array having a plurality of active regions arranged on the substrate so as to emit light toward the same direction, the plurality of active regions being disposed at ends of the array more densely than in the center of the array in a direction crossing the light emitting direction;
   a semiconductive burying layer which buries the plurality of active regions so as to bury the above area and side area of each active region; and
   an electrode which is provided over the plurality of active regions,
   wherein the distance from the center of the array to each of the active regions increases like a non-linear logarithmic function in order of the active regions, wherein the intervals of the active regions in the array are unequal.

2. The optical semiconductor device according to claim 1, wherein thermal conductivity of the burying layer is 1 W/(m·K) or higher.

3. The optical semiconductor device according to claim 1, wherein the difference between the distance from the center of the array to each of the active regions and a value of the logarithm function which increases in order of the active regions is within 30% of the value of the logarithm function.

4. The optical semiconductor device according to claim 1, wherein a direction of emitting light from the plurality of active regions is parallel to the substrate.

5. The optical semiconductor device according to claim 1, wherein a direction of emitting light from the plurality of active regions is perpendicular to the substrate.

6. The optical semiconductor device according to claim 1, wherein the plurality of active regions are disposed more densely at ends of the array than in the center of the array in a direction orthogonal to the light emitting direction.

7. A light emitting device, comprising:
    an optical semiconductor device including
    a first substrate of semiconductor,
    an array having predetermined number of active regions arranged on the first substrate so as to emit light toward the same direction, the predetermined number of active regions being disposed more densely at ends of the array than in the center of the array in a direction crossing the light emitting direction, and
    a semiconductive burying layer which buries the predetermined number of active regions so as to bury the above area and side area of each active region,
    wherein the distance from the center of the array to each of the active regions increases like a non-linear logarithmic function in order of the active regions, wherein the intervals of the active regions in the array are unequal; and
    an electrode which is provided over the predetermined number of active regions,
    the optical semiconductor device being disposed on a second substrate; and
    the predetermined number of optical waveguides disposed on the second substrate and receiving and propagating light emitted from the active regions in the optical semiconductor device.

8. The light emitting device according to claim 7, further comprising the predetermined number of light modulating elements disposed on the second substrate, modulating light propagated from the predetermined number of optical waveguides, and outputting the modulated light.

9. A method of manufacturing an optical semiconductor device, comprising:
    forming an array having a plurality of active regions for emitting light to the same direction on a substrate of semiconductor, the plurality of active regions being arranged so as to be more densely at ends of the array than in the center of the array in a direction crossing the light emitting direction and the distance from the center of the array to each of the active regions increases like a non-linear logarithmic function in order of the active regions, wherein the intervals of the active regions in the array are unequal;
    burying the plurality of active regions with a semiconductive burying layer so as to bury the above area and side area of each active region; and
    forming an electrode on the plurality of active regions.

10. The optical semiconductor device according to claim 1, wherein the semiconductive burying layer has thermal conductivity equal to or higher than 50 W/(m·K).

11. The optical semiconductor device according to claim 1, wherein the array has active regions equal to or more than five and the size of the optical semiconductor device in the direction crossing the light emitting direction is equal to or less than 600 μm.

12. The light emitting device according to claim 7, wherein the semiconductive burying layer has thermal conductivity equal to or higher than 50 W/(m·K).

13. The light emitting device according to claim 7, wherein the array has active regions equal to or more than five and the size of the optical semiconductor device in the direction crossing the light emitting direction is equal to or less than 600 μm.

14. The method of manufacturing an optical semiconductor device according to claim 9, wherein the semiconductive burying layer has thermal conductivity equal to or higher than 50 W/(m·K).

15. The method of manufacturing an optical semiconductor device according to claim 9, wherein the array has active regions equal to or more than five and the size of the optical semiconductor device in the direction crossing the light emitting direction is equal to or less than 600 μm.

* * * * *